United States Patent [19]
Hebard et al.

[11] Patent Number: 5,171,373
[45] Date of Patent: Dec. 15, 1992

[54] DEVICES INVOLVING THE PHOTO BEHAVIOR OF FULLERENES

[75] Inventors: Arthur F. Hebard, Bernardsville; Barry Miller, Murray Hill; Joseph M. Rosamilia, Berkeley Heights; William L. Wilson, Somerville, all of N.J.

[73] Assignee: AT&T Bell Laboratories, Murray Hill, N.J.

[21] Appl. No.: 738,005

[22] Filed: Jul. 30, 1991

[51] Int. Cl.[5] ................................ H01L 31/028
[52] U.S. Cl. .................. 136/252; 136/255; 357/8; 357/15; 357/30; 429/111; 430/71; 250/214.1; 250/214 SG; 257/40; 257/43; 257/431
[58] Field of Search ............... 136/252, 255, 263; 250/211 R, 211 J, 212; 357/8, 15, 30 R; 429/111; 430/71

[56] References Cited

PUBLICATIONS

Chemtracts-Organic Chemistry-vol. 4, pp. 231-233 (1991).
P. V. Kamat, J. Am. Chem. Soc., vol. 113, pp. 9705-9707 (1991).
J. Mort et al, Chem. Phys. Lett., vol. 186, pp. 281-283 (1991).
N. Minami, Chem. Lett., pp. 1791-1794 (1991).
G. K. Wertheim et al, Science, vol. 252, pp. 1419-1421 (1991).
K. Pichler et al, J. Phys. Condens. Matter, pp. 9259-9270 (1991).
Y. Wang, Nature, vol. 356, pp. 585-587 (Apr. 1992).
J. W. Arbogast, J. Phys. Chem., vol. 95, pp. $11 \propto 12$ (1991).
B. Miller et al, J. Am. Chem. Soc., vol. 113, pp. 6291-6293 (1991).
Hebard, A. F. et al, Applied Physics Letters, 41(12) Dec. 15, 1982, pp. 1130-1132.
Kroto, H. W. et al, Nature, 318, 162 (1985).
Guay, D. et al, Journal of the Electrochemical Society, 134, 2942 (1987).
Kratschmer, W. et al, Nature, 347, 354 (1990).

Primary Examiner—Aaron Weisstuch
Attorney, Agent, or Firm—B. S. Schneider

[57] ABSTRACT

It has been found that fullerenes exhibit photoelectronic behavior such as photoconductivity or photovoltaic properties. Such behavior allows the fabrication of a variety of devices, such as solar cells and the use of various light-induced processes, such as the generation of a current by illumination of appropriate fullerene interfaces.

5 Claims, 5 Drawing Sheets

DEVICES INVOLVING THE PHOTO BEHAVIOR OF FULLERENES

BACKGROUND OF THE INVENTION

1. Field of the Invention

This invention relates to organic compounds and, in particular, organic compounds exhibiting photoelectronic behavior, as well as processes based on such behavior.

2. Art Background

Recently there has been significant interest in organic materials that are either conductive or that can be doped to produce conductivity. Such organic materials have been suggested for a wide variety of uses that depend on their conductivity. For example, organic materials are generally easily formed in thin films as conductive components in devices such as switches.

The classic carbon-based conductors are graphite and polyacetylene. (Graphite is characterized by an infinite sheet-like structure of the element carbon.) Graphitic materials typically have conductivities in the range $10^3$ to $10^5$ Siemens/cm, but are intractable and therefore for some applications do not lend themselves to fabrication of the desired devices. Polyacetylene when doped has conductivities as high as $10^4$ Siemens/cm, but can be processed only during its preparation. Other organic conductors, such as those based on tetrathiafulvalene, have high conductivities ($10^3$ Siemens/cm), but again are difficult to form into desired geometries. (See, for example, U.S. Pat. No. 4,249,013 dated Feb. 3, 1981.)

A class of nascent carbon based materials are those based on fullerenes. Such materials are prepared by an electronic discharge process as described in H. W. Kroto, et al., *Nature* 318, 162 (1985) and W. Kratschmer, et al., *Nature* 347, 354 (1990). These compositions, as reported, are wide band gap materials. Attempts have been made to modify these materials to improve their conductivity. For example, as reported by F. Wudl, at the *Materials Research Society Meeting*, Nov. 29, 1990, Boston, MA., a tetraphenylphosphonium salt of fullerene has been made, but exhibited a conductivity no greater than $10^{-5}$ Siemens/cm.

A variety of organic materials have also been found to exhibit various electronic effects induced by their interaction with electromagnetic radiation. For example, phthalocyanine derivatives have been shown in a liquid junction solar cell to exhibit a photovoltaic effect, and thus to allow generation of an electrical current when the organic material is illuminated with radiation in the wavelength range 400 nm to 900 nm. (See D. Guay et al, *Journal of the Electrochemical Society*, 134, 2942 (1987).) Additionally, materials such as anthracene, have also exhibited photoconductivity as described by Gutmann and Lyons in *Organic Semiconductors*, Wiley & Sons, New York (1967). Such organic materials, when subjected to light in the wavelength range of the near u.v., provide photoelectrons and a resulting electrical current. (See also *Electronic Processes in Organic Crystals*, ed. M. Pope and C. Swenberg, Clarendon Press, Oxford, 1982.)

The photovoltaic effect has been shown useful in a variety of processes, such as the generation of a photovoltage in solar cells in photoinduced chemical conversion. Similarly, the photoconductive effect has been used to generate a current that, in turn, is applied to resistance control devices such as photodetectors. The use of organic materials in these applications is considered alluring because of versatile properties and fabrication ease. Thus, research has been directed to the discovery of organic and other carbon-based materials that exhibit photoelectronic behavior, and the discovery of each such material has been considered significant.

SUMMARY OF THE INVENTION

It has been found that fullerenes and doped fullerenes exhibit photoelectronic effects, e.g., a photoconductive effect, and when interfaced with appropriate materials, a photovoltaic effect. Thus, these materials are useful in devices such as solar cells, electrochemical cells, and radiation detectors to perform processes such as the photo-induced generation of current, the photo-induced reaction of chemicals, or to sense radiation. For example, the illumination of $C_{60}$ with light in the wavelength range 300 to 400 nm in a device configuration discussed in the examples, induces a fivefold to 1000 fold current increase. Similarly, the contact of $C_{60}$ deposited onto a noble metal electrode and inserted into an iodide/tetra n-butyl ammonium perchlorate/acetonitrile composition yields a photovoltage when illuminated with light in the wavelength range 400 to 750 nm. Surprisingly, such photovoltage over a voltage range up to +1.3 volts versus an aqueous saturated calomel electrode (SCE) is useful for producing chemical reactions such as the oxidation of iodide to iodine without the degradation of the $C_{60}$ electrode. This wide range of useful voltage behavior is quite unusual for non traditional carbon-based materials.

DETAILED DESCRIPTION

As discussed, the invention involves the photoelectronic properties of fullerenes. (A photoelectronic effect is one where incident electromagnetic radiation induces generation of charge carriers that subsequently modify the electrical properties of the device through the accumulation of charge in the device or flow of charge through the device to electrical leads i.e., electrodes.) These fullerenes are molecular compounds characterized by 1) a network including essentially only carbon atoms, 2) where essentially all these carbons are bound to only three other carbons, and 3) where these carbons are spatially distributed in the molecule so that each carbon constitutes a vertex of a finite polyhedron. The invention also includes fullerenes, as defined above, where no more than 10% of the carbon atoms are modified by 1) addition of a substituent, 2) replacement with a different atom other than carbon, or 3) absence from the carbon skeleton. Additionally, these fullerenes also include the above identified materials including possible modifications when combined with dopants, (such as described in U.S. patent application Ser. No. 07/671,275, dated Mar. 18, 1991, which is hereby incorporated by reference), such as alkali metals, e.g., potassium, sodium, and lithium.

The invention relies on processes where a photoelectronic effect (e.g., photovoltaic and photoconductive) in a structure including a fullerene is employed to perform useful functions deriving from electromagnetic radiation excited charge separation. Exemplary of these processes is the illumination of the fullerene to produce a photocurrent which, in turn, is employed to do chemical conversion at an electrode or indicate the presence of exciting radiation. Similarly, a fullerene is interfaced with a suitable material and illuminated to produce separation of charge. This separation of charge is then usefully employed to perform light to electrical power conversion. Although other photoelectronic properties of devices employing fullerenes are not precluded, the above effects have been found to be particularly advantageous. For pedagogic purposes, the remaining of the description will be in terms of the photovoltaic and photoconductive effects, and suitable devices for practicing the inventive processes associated with these effects.

Photovoltaic Effect

Figure 1:
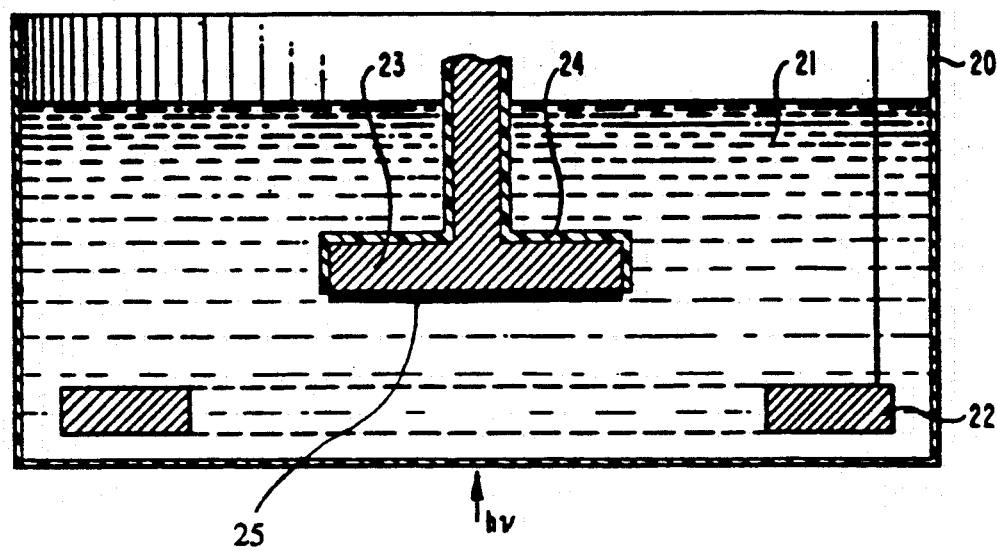
FIGS. 1, 8, and 9 are illustrative of configuration involved in the invention.

Exemplary of processes and devices involved in the photovoltaic effect in fullerenes is solar cells. For example, a liquid junction solar cell is advantageously formed from a fullerene-based electrode contacting a liquid electrolyte. The general description and properties of liquid junction cells have been extensively described in compendiums such as *Semiconductor Electrodes*, H. Finklea, ed., Elsevier, New York, 1988. The geometry of the cell and of the fullerene electrode is not critical. A typical configuration is shown in FIG. 1. Typically, the fullerene is cast from solution onto a noble metal to form the electrode. For example, $C_{60}$ produced by the process described in Kratschmer et al supra, is dissolved in a solvent such as benzene. This solution is then applied to a noble metal, such as palladium, and the solvent is evaporated in the ambient. Alternatively, the fullerene is sublimated onto the electrode structure.

The electrolyte chosen for the particular fullerene should not dissolve the film. Since most useful organic electrolytes are in this category, this criterion is not critical. Acetonitrile is a useful example. The electrolyte should preferably have a redox potential window from −1 to +1 versus aqueous SCE. (However, electrolytes with potentials outside this range are useful and are not precluded.) Suitable conductive entities for the electrolyte are listed in compendiums such as R. N. Adams, *Electrochemistry at Solid Electrodes*, M. Dekker, New York, 1969. The composition of the counterelectrode is also not critical, and noble metals, e.g., platinum, as well as materials such as graphite, are useful.

When light in the wavelength range 400 to 700 nm is used to illuminate the fullerene material, a photovoltage is produced. (Indeed, wavelengths below 400 nm to the absorption edge of the solvent are also useful. However, some ultraviolet degradation in the presence of oxygen seems to occur.) This photovoltage is useful for driving a chemical reaction such as iodide oxidation, or for producing a current that is employed, for example, to perform work. Since the fullerene is illuminated, an optically-transparent path to the illuminating radiation. Typically, the concentration of the redox component is 0.001 Molar to its solubility limit. The thickness of the fullerene film depends on its optical density. Typically, films having a thickness in the range 0.1 to 10 $\mu$m are employed. Films thinner than 0.1 $\mu$m, generally do not have reliable continuity or sufficient light absorption, while films thicker than 10 $\mu$m, are not advantageous because they are subject to excessive resistive losses.

Photoconductivity

Figure 8:
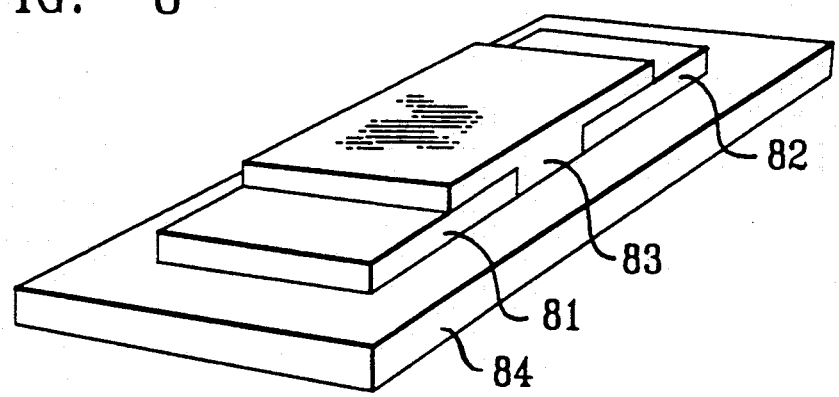
Figure 9:
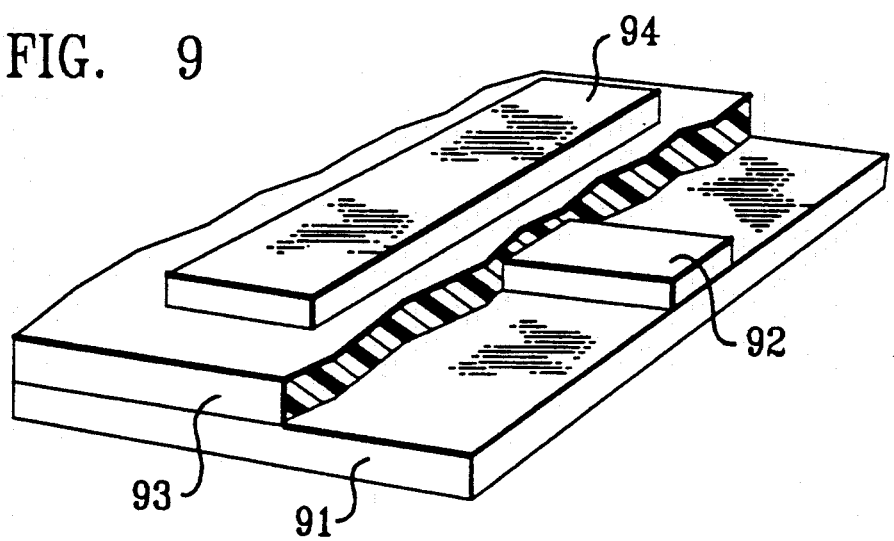

As discussed, current generated through photoconductivity is useful in applications such as electromagnetic radiation detection. The particular geometry employed to generate electrons in the fullerene and to remove these electrons is not critical. For example, fullerene is formed in a strip line configuration on spatially separated conductive electrodes 81, 82, such as silver as shown in FIG. 8 or in a sandwich configuration with aluminum and indium oxide electrodes 92 and 94, respectively, as shown in FIG. 9. The fullerene material, 83 or 93, is then illuminated generally with electromagnetic radiation as described above for photovoltaic applications. As a result, increases greater than thousandfold in current are observed with a 20 volt bias in a strip line with a gap of 75 $\mu$m. Generally, films having a thickness of at least 1 times the absorption length at the incident absorbed radiation frequency are desired. (If the incident radiation has a broad frequency range this determination is made at the wavelengths of least sensitivity over the wavelength range of desired applicability.)

It is possible that the fullerene/metal electrode produces an interface that is a Schottky barrier. Thus, in illuminating the fullerene, both the photoconductive and photovoltaic effects are present. This combination is advantageous because the internal resistance of the device is decreased simultaneously with photovoltage production. Additionally, a photovoltaic effect is also achievable by producing a carrier gradient in the longitudinal direction of the fullerene between the electrodes. This gradient is produced, for the device shown in FIG. 8, by applying a voltage, generally in the range 1 to 25 volts, across the material in the longitudinal direction, while subjecting the material to a vapor-phase flow of a dopant, e.g., potassium. (Gaps substantially larger than 100 $\mu$m require a concomitant increase in voltage.) As a result of this procedure, a photovoltaic effect, in conjunction with the photoconductive effect, is produced that is separable from any Schottky barrier formed at the electrode/fullerene interface. Alternatively, a carrier gradient is produced by regulating the flow and direction of dopant relative to the size and position of the fullerene substrate.

The following examples are illustrative of device configurations and processes involved in the invention.

EXAMPLE 1

Figure 2:
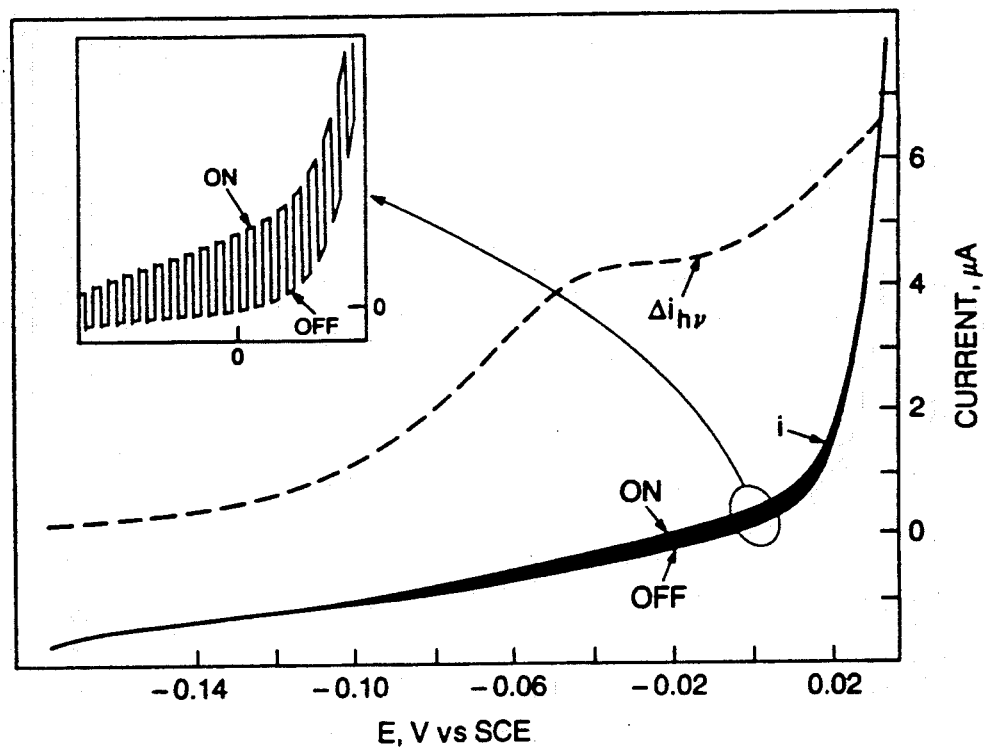
FIGS. 2 through 7 are illustrative of electrical properties involved in the inventive processes and devices.

The cell structure of FIG. 1 including a container 20, electrolyte 21, carbon counter electrode 22, platinum active electrode 23 coated with the fullerene film 25 was employed. The fullerene film was produced by evaporation of the benzene solvent from a benzene solution of the fullerene to yield a 100 nm thick film. The electrode was insulated with TEFLON ® polymer 24. The supporting electrolyte 21 for the embodiment of the device was acetonitrile containing the salt tetra n-butyl ammonium perchlorate at a concentration of 0.3M. The electroactive species was iodide (0.1M), present as the tetra butyl ammonium iodide salt. The cell container 20 was glass which was stable to the solvent and also transparent to near uv and visible light to allow illumination of the fullerene film electrode. A SCE was also inserted into the electrolyte to allow for potential control of the fullerene film electrode. (The reference electrode was not necessary for the use of the cell as pictured in FIG. 1 for light to energy conversion, but is employed to illustrate the working function in the controlled manner well known in electrochemistry.) FIG. 2 shows a controlled potential scan at 2 mV/s under 14 Hz chopped, 30 mW Ar ion laser (mainly 488 and 514 nm radiation). The OFF indication is the trace level with no illumination, ON shows the current when the light is reaching the electrode. A clear photocurrent response over the region −0.1 to +0.02 V vs. SCE is shown. The inset shows the active region of the trace under slow chopping of the light (0.2 Hz) which illustrates the magnitude of the effect more clearly. (The 14 Hz signal is damped by the mechanical recorder employed.)

EXAMPLE 2

Figure 3:
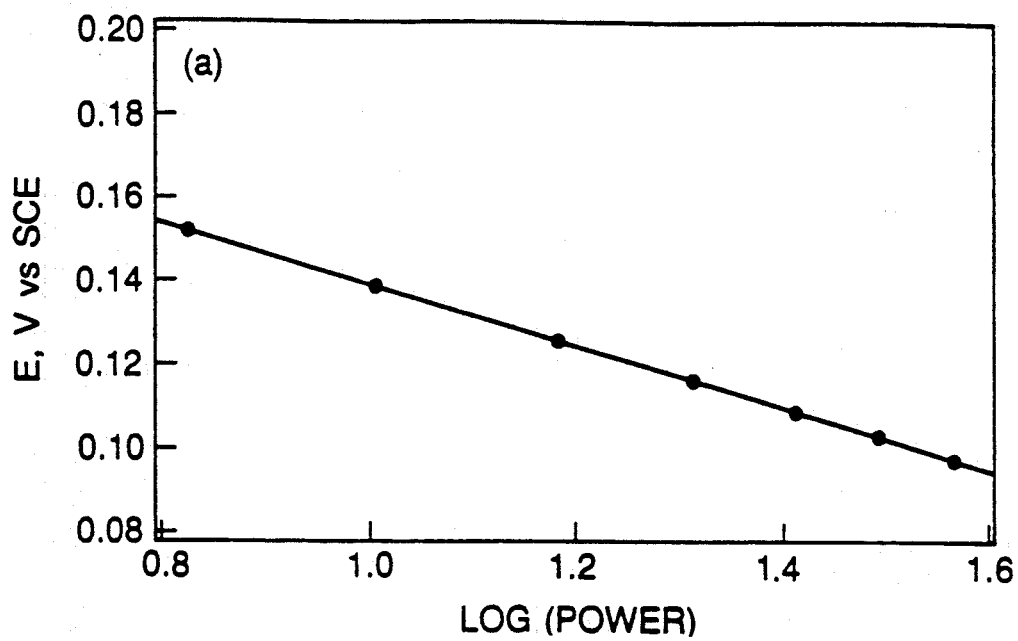
Figure 4:
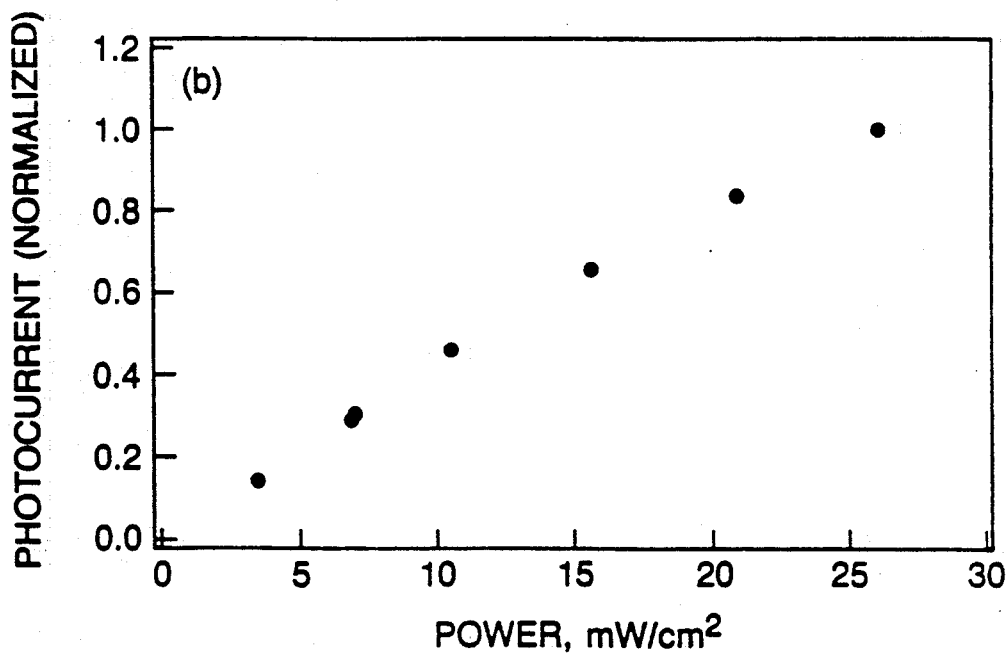

A cell identical to that of Example 1 was formed, except that the iodide concentration was 0.001 molar, the open circuit potential of the fullerene electrode was measured as a function of Ar laser input power and is shown in FIG. 3. The response is linear with the log of input power (74 mV/decade of input power) as expected for a semiconductor-liquid junction photoelectrochemical cell, with, in this case, a quality factor of $0.074/2.303RT/F=1.25$. In this same cell the relation of photocurrent to input power is shown in FIG. 4. The response was linear at low levels, as expected, and deviates from linearity only at high powers relative to the properties of the low (0.001 molar) iodide concentration.

Figure 5:
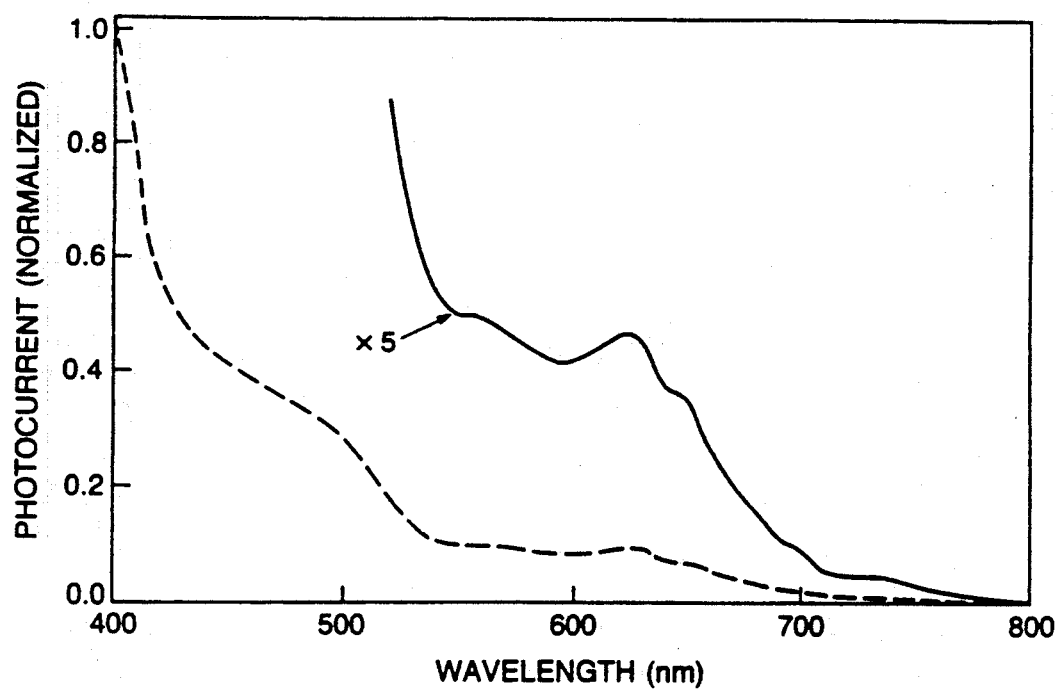

In a cell identical to that used for Example 1, the spectral response of the photocurrent is given vs. wavelength in FIG. 5. The response covered the visible part of the spectrum and was still rising below 400 nm, the limit of the halogen source used in this Example. The band gap indicated from this data is about 1.7 ev.

EXAMPLE 3

A glass rectangule 91 as shown in FIG. 9, approximately 1 cm×2.5 cm in dimension, was cleaned by immersion in a soap-based cleaning solution. The substrate was then sequentially washed in deionized water, acetone, and methanol. The substrate was placed on the sample holder of a conventional evaporation apparatus. A shadow mask was employed with the opening in the mask measuring approximately 0.53 mm wide and extending the 1 cm length of the substrate. The thermal evaporation of aluminum was initiated and continued for approximately 30 seconds to yield a 100 nm thick aluminum strip 92 on the substrate.

The substrate was then removed and placed into a second evaporation apparatus. This apparatus was equipped with an alumina crucible that had been charged with about 15 mg of $C_{60}$ prepared as described in Hadden et al, *Nature*, 350, No. 6316, pp 320-322 (1991). A shutter was positioned between the crucible and the substrate, and the apparatus was evacuated to a pressure of $1.5\times10^{-6}$ Torr the temperature of the crucible was raised over an interval of approximately 5 minutes to 200° C. The crucible was maintained at this temperature for half an hour and then raised to a temperature of 300° C. over an interval of approximately 2 minutes. When the 300° C. temperature had been attained, the shutter was removed and evaporation onto the substrate was allowed to progress for forty minutes to produce an evaporated thickness 93 on the substrate of approximately 445 nm. The shutter was closed, the system was backfilled with nitrogen, and the sample removed.

The substrate was then placed on the sample holder of a reactive ion beam sputtering apparatus described in Hebard and Nakahara, *Applied Physics Letters*, 41 (12), 1130 (1982). The surface was shadow masked with a mask having five evenly-spaced openings across the width of the substrate, each opening being approximately ¼ mm in width and running the full width of the substrate. The apparatus was evacuated to a pressure of $2\times10^{-6}$ Torr. A 20 nm thick indium oxide film 94 was deposited using an ion beam current density at the gun of 1.0 milliamp per sq. cm$^2$ and an argon ion beam with energy of 500 V incident on the indium target. The indium target was biased at −3 kV and the oxygen was introduced into the chamber at a pressure of $5.5\times10^{-4}$ Torr. Argon was introduced into the chamber to give a total pressure of $2\times10^{-3}$ Torr. As a result, a sandwich structure with $C_{60}$ between crossed electrodes of aluminum and indium oxide was prepared.

Four gold wires for each junction were prepared by placing a bead of indium at one end of each wire. This bead was then pressed onto the substrate at each end of each electrode stripe with the indium extending beyond the periphery of the stripe. Using these electrical connections, a standard four probe measurement was made to determine the change of resistance upon illumination. This illumination was provided at a wavelength of 355 nm (beam size 250 μm in diameter) at a power of 0.5 mW and was pulsed at a repetition rate of 76 megahertz with a pulse duration of 60 picoseconds. The junction resistance in the dark was 3 GΩ and when illuminated was 0.6 GΩ.

EXAMPLE 4

Figure 6:
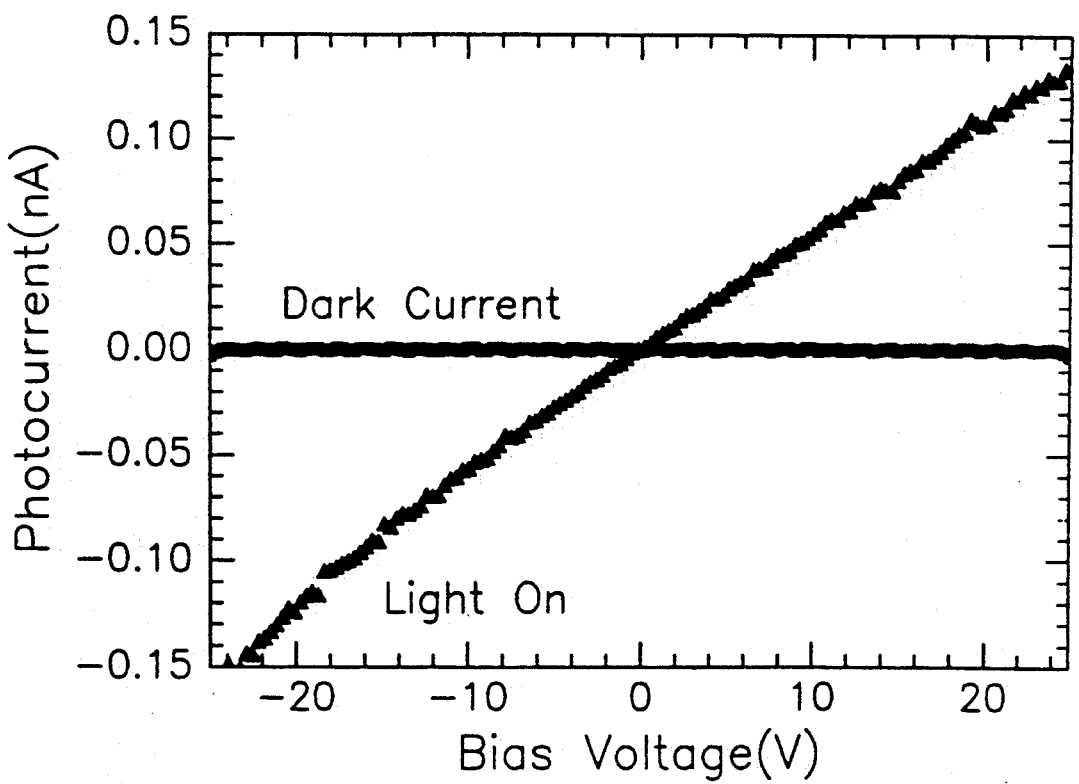

A quartz substrate 84 measuring 7 mm×7 mm (about 2 mm thick) was cleaned as described for the glass substrate for Example 3. The substrate was masked so that after evaporation the evaporated material would form two strips 81 and 82, 4 mm in width, separated by a spacing of 75 μm. A silver evaporation was performed as described for the aluminum evaporation in Example 3 to yield an electrode thickness of approximately 100 nm. Platinum wire leads, 0.020 inches in diameter, were attached with conducting silver epoxy to each of these strips. As described in Example 3, a $C_{60}$ film 83 was evaporated onto the substrate until a thickness of 310 nm was achieved. The substrate was mounted on a vacuum feed-through by suspending the substrate by its electrical leads. The feed-through also included a SAES Getters potassium metal dispenser. The feed-through was employed to introduce the substrate into a vacuum chamber whose pressure was maintained at approximately $3\times10^{-7}$ Torr. An optical path was provided so that external laser light could be made incident on the quartz substrate from the bottom side, and thus incident on the $C_{60}$ present in the gap between the silver electrodes. A laser illumination as described in Example 3 with a beam spot of 100-200 μm and a total power of 1 mW was used. There was no open circuit photovoltage due to the symmetric configuration employed. The dark current was measured to be less than 0.1 picoamps with a bias voltage of 20 volts. During illumination, a photocurrent of 133 picoamps was observed. FIG. 6 shows a graph of photocurrent vs. bias voltage for both the illuminated and non-illuminated samples. The photocurrent showed a linear relationship to bias voltage for fixed incident radiation intensity (as shown in FIG. 6) and also to incident radiation intensity for fixed bias.

EXAMPLE 5

Figure 7:
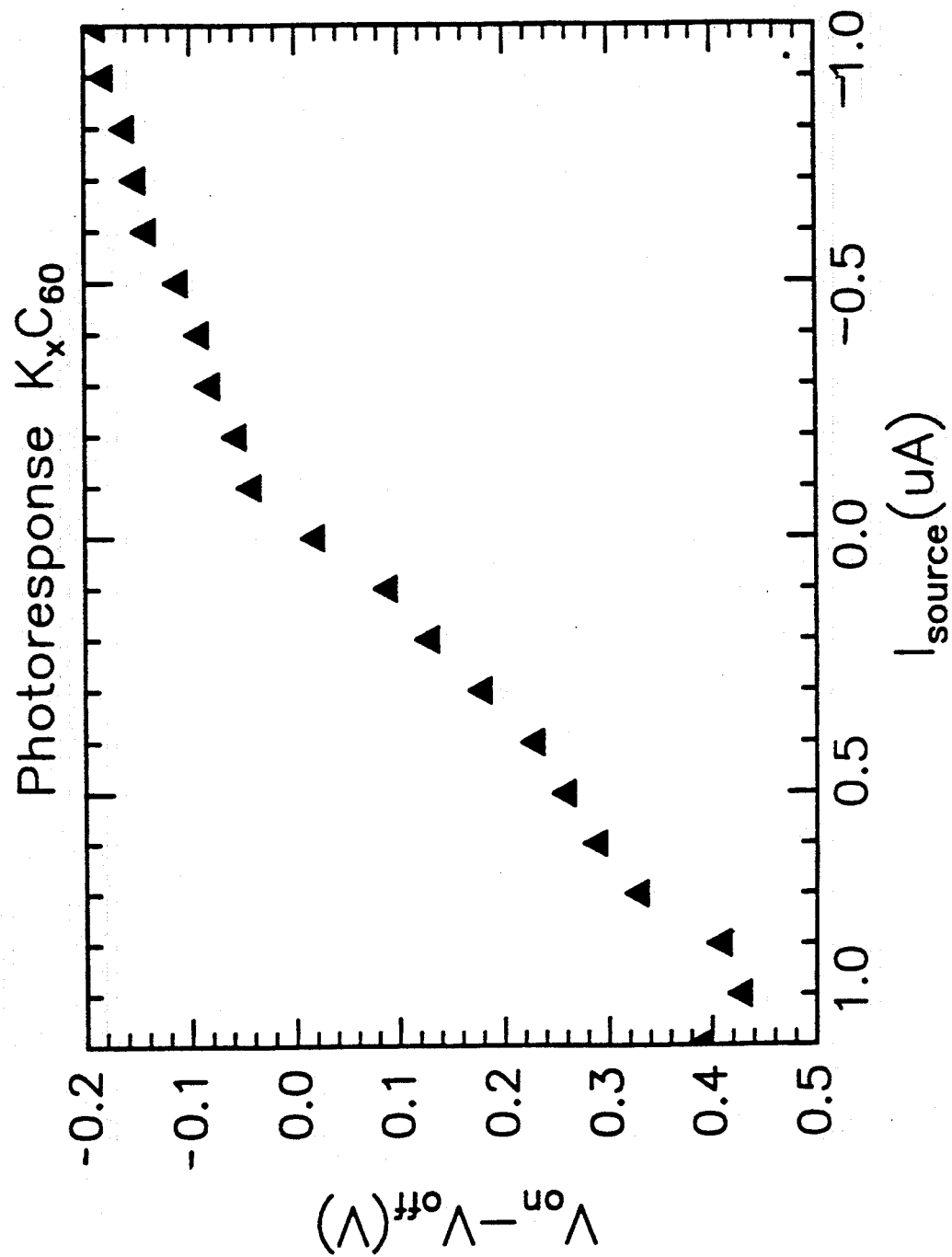

The procedure of Example 4 was performed and after initial measurement, a current of 5 amps was applied across the potassium dispenser for a period of 5-10 minutes. (This procedure was done to preheat the potassium source.) Before pre-heating a voltage of approximately 20 volts was applied across the two silver electrodes of the sample. This voltage was maintained and the amperage applied to the potassium source was raised to 6 amps for one minute. This current was sufficiently high to provide a potassium flux. The sample was allowed to cool. The sample exhibited an open circuit voltage in the dark of 0 mV as measured using an electrometer. Upon illumination, an open circuit photovoltage of 20 mV was observed. The sheet resistance of the material in the gap without illumination was 1.2 GΩ per□. FIG. 7 shows a plot of the differential photovoltage (difference between illuminated and non-illuminated voltage) vs. applied current.

After the above measurements were made, the potassium source was further heated using a current of 6 amps for 10 minutes with an applied voltage between the silver electrodes of 20 V without illumination being maintained during this additional potassium evaporation. The measured current between the silver electrodes was 0.7 microamps at the beginning of evaporation and greater than 100 microamps at the end. After evaporation no photovoltage was observed and the change in resistance due to illumination was undetected due to the relatively large dark current. A contemplated explanation for this effect is that the material upon additional doping becomes metallic in character.

We claim:

1. A process comprising the steps of making electromagnetic radiation incident on a material that is part of a device, said material comprising a fullerene, inducing the generation of charge carriers through the interaction of said radiation with said material, wherein said charge carriers remain in or travel through said device to electrodes, resulting in a change of electrical properties of said device and detecting or employing said change.

2. The process of claim 1 wherein said inducing occurs due to photoconductivity of said material.

3. The process of claim 1 wherein said inducing occurs due to a photovoltaic effect produced through the interface of said material with a second material of different composition.

4. The process of claim 1 wherein said employing comprises generating an electrical current or voltage.

5. The process of claim 1 wherein said change causes a current flow.

* * * * *